US008286010B2

(12) United States Patent
Malik et al.

(10) Patent No.: US 8,286,010 B2
(45) Date of Patent: Oct. 9, 2012

(54) VOLTAGE SENSOR FOR HIGH-CURRENT JUNCTION

(75) Inventors: Randhir S. Malik, Cary, NC (US); Cecil C. Dishman, Raleigh, NC (US); Thomas S. Mazzeo, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 12/614,925

(22) Filed: Nov. 9, 2009

(65) Prior Publication Data

US 2011/0113262 A1    May 12, 2011

(51) Int. Cl.
*G06F 1/00* (2006.01)
*G06F 1/16* (2006.01)
*G06F 11/00* (2006.01)
*H02J 1/00* (2006.01)
*H02J 1/10* (2006.01)
*H01H 47/00* (2006.01)
*G05F 3/06* (2006.01)
*G01R 31/08* (2006.01)
*G01R 31/04* (2006.01)
*G01R 31/40* (2006.01)
*G01R 19/00* (2006.01)
*H02H 3/00* (2006.01)
*H02H 3/08* (2006.01)
*H02B 1/00* (2006.01)

(52) U.S. Cl. ............ 713/300; 307/11; 307/43; 307/125; 307/151; 324/522; 324/538; 324/764.01; 361/79; 361/88; 361/93.1; 361/601; 361/679.02; 702/64; 714/14; 714/22

(58) Field of Classification Search .................. 713/300; 307/11, 43, 125, 151; 324/522, 538, 764.01; 361/79, 88, 93.1, 601, 679.02, 748; 702/64; 714/14, 22
See application file for complete search history.

(56) References Cited

U.S. PATENT DOCUMENTS

| | | | |
|---|---|---|---|
| 4,110,683 A | 8/1978 | Cason et al. | |
| 5,332,927 A | 7/1994 | Paul et al. | |
| 6,950,950 B2 | 9/2005 | Sawyers et al. | |
| 6,970,042 B2 | 11/2005 | Glueck | |
| 7,239,495 B2 | 7/2007 | Mori et al. | |
| 7,327,052 B2 | 2/2008 | Korsten et al. | |
| 7,932,632 B2 * | 4/2011 | Zhang et al. | 307/43 |
| 8,098,468 B2 * | 1/2012 | Zhu et al. | 361/91.1 |
| 2006/0119368 A1 * | 6/2006 | Sela et al. | 324/522 |
| 2006/0161794 A1 * | 7/2006 | Chiasson et al. | 713/300 |
| 2009/0167537 A1 * | 7/2009 | Feliss et al. | 340/584 |
| 2011/0320849 A1 * | 12/2011 | Cochran et al. | 713/340 |

* cited by examiner

*Primary Examiner* — Stefan Stoynov
(74) *Attorney, Agent, or Firm* — Steven Bennett

(57) ABSTRACT

A system includes a high-current junction, a voltage sensor, and a controller. Power connectors of two components are electrically connected at the high-current junction, where a high current passes between the two components at the high-current junction. The voltage sensor detects a voltage at the high-current junction. The controller performs a predetermined action in response to the voltage sensor detecting the voltage at the high-current junction being greater than a predetermined threshold voltage. The system may be a data center rack. The high-current junction may be the junction at which an alternating current (AC) input receives AC power from AC mains. The high-current junction may alternatively be the junction at which a power supply receives the AC power from the AC input to generate direct current (DC) power to provide to data center rack components insertable within the data center rack.

19 Claims, 3 Drawing Sheets

VOLTAGE SENSOR FOR HIGH-CURRENT JUNCTION

FIELD OF THE INVENTION

The present invention relates generally to high-current junctions, such as those that are susceptible to fire risks if they dissipate too much power, and more particularly to voltage sensors for such high-current junctions, to determine that the high-current junctions are apt to cause fire risks.

BACKGROUND OF THE INVENTION

Data centers have large numbers of computing devices installed computing devices, usually in a space-efficient manner. One space-efficient manner to install large numbers of computing devices is to have a number of the computing devices installed within a data center rack. The computing devices may be blade computing devices, which can slide into corresponding slots of the data center rack. The blade computing devices are typically smaller in size than ordinary computing devices like desktop computers. A blade computing device can share a power supply with a number of other blade computing devices, to further minimize the space needs within the data center.

SUMMARY OF THE INVENTION

A data center rack includes an alternating current (AC) input, a power supply, a conductor, first and second high-current junctions, first and second voltage sensors, and a controller. The AC input receives AC power from AC mains. The power supply receives the AC power from the AC input and generates direct current (DC) power to provide to one or more data center rack components insertable within the data center rack. The conductor connects the AC input to the power supply. The AC input is removably connected to the conductor at the first high-current junction, where a high current passes from the AC input to the conductor. The power supply is removably connected to the conductor at the second high-current junction, where the high current passes from the conductor to the power supply. The first voltage sensor detects a first voltage at the first high-current junction, and the second voltage sensor detects a second voltage at the second high-current junction. The controller performs a predetermined action in response to one or more of the first voltage sensor detecting the first voltage being greater than a predetermined threshold voltage and the second voltage sensor detecting the second voltage being greater than the predetermined threshold voltage.

A system of an embodiment of the invention includes a high-current junction at which power connectors of two components are electrically connected, where a high current passes between the two components at the high-current junction. The system includes a voltage sensor to detect a voltage across the high-current junction. The system also includes a controller to perform a predetermined action in response to the voltage sensor detecting the voltage at the high-current junction being greater than a predetermined threshold voltage.

A method of an embodiment of the invention provides a first voltage sensor to detect a first voltage at a first high-current junction of a data center rack. The first high-current junction removably connects an AC input of the data center rack to a conductor of the data center rack, where a high current passes from the AC input to the conductor, and where the AC input is to receive AC power from AC mains. The method provides a second voltage sensor to detect a second voltage at a second high-current junction of a data center rack. The second high-current junction removably connecting the conductor to a power supply of the data center rack, where a high current passes from the conductor to the power supply. The power supply receives power from the AC input to generate DC power to provide to one or more data center rack components insertable within the data center rack. The method programs a controller of the data center rack to perform a predetermined action in response to one or more of the first voltage sensor detecting the first voltage being greater than a predetermined threshold voltage and the second voltage sensor detecting the second voltage being greater than the predetermined threshold voltage.

BRIEF DESCRIPTION OF SEVERAL VIEWS OF THE DRAWINGS

The drawings referenced herein form a part of the specification. Features shown in the drawing are meant as illustrative of only some exemplary embodiments of the invention, and not of all embodiments of the invention, unless otherwise explicitly indicated, and implications to the contrary are otherwise not to be made.

DETAILED DESCRIPTION

Figure 1:
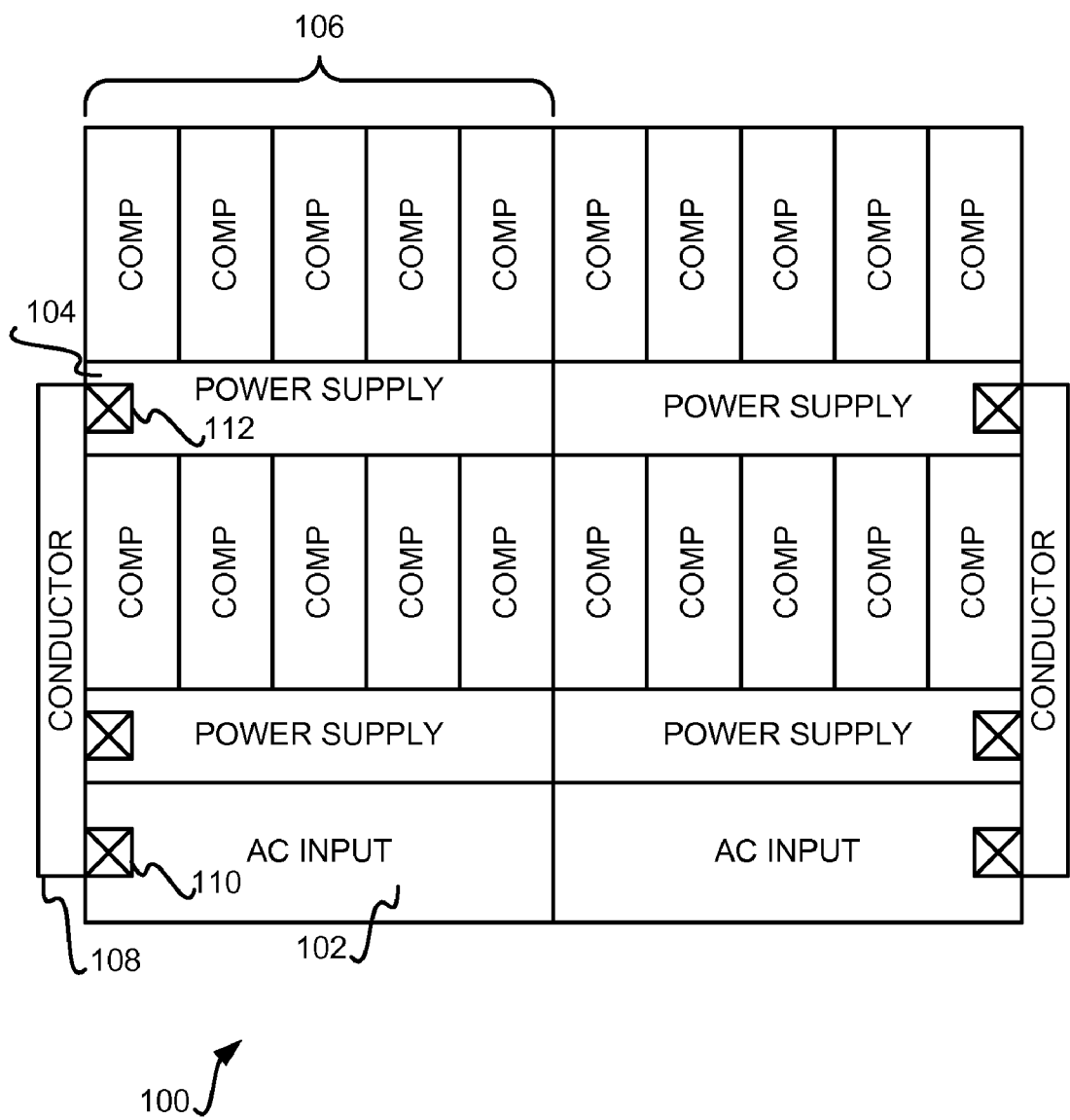
FIG. 1 is a diagram of a representative data center rack, according to an embodiment of the present invention.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

As noted in the background section, a data center can include a data center rack in which a number of components, such as computing devices, may be installed as blades within corresponding slots of the data center rack, to share a smaller number of power supplies installed within the data center rack. A data center rack typically has a number of high-current junctions. A high-current junction is a location at which two components of the data center rack, such as power supplies, high-current conductors, and power inputs, are connected for high current to pass between the components. One such high-current junction may be the location at which a power supply is removably connected to a high-current conductor, whereas another high-current junction may be the location at which a power input is removably connected to a high-current conductor.

There are potential problems associated with such high-current junctions. First, the high-current junctions may be "hot plug" type junctions, in which components can be connected to the junctions without having to first remove power from the data center rack. Such "hot plug" high-current junctions are susceptible to having increased electrical resistance over time. Second, if a component makes a poor connection at the high-current junction, such as due to a user not properly seating the component within the data center rack, the high-current junction may also have increased electrical resistance. Such increased electrical resistance results in the amount of electrical power dissipated by the high-current junction also increasing, in the form of heat. The resulting increase in temperature can render the high-current junction susceptible to increased fire risks.

Conventionally, the increased temperature of a high-current junction is detected by using a temperature sensor, such as a thermocouple, or by an infrared camera. When the temperature sensor or the infrared camera indicates that the temperature at the high-current junction has increased beyond a preset temperature threshold, a user of the data center rack is notified to take corrective action, so as to prevent a fire from occurring at the high-current junction. However, existing temperature sensors and infrared cameras are relatively expensive. Because a data center may have a large number of data center racks, and each data center rack may have a large number of high-current junctions, installing temperature sensors or infrared cameras can be economically infeasible.

The inventors have developed a novel approach that by comparison does not employ expensive temperature sensors or infrared cameras to directly monitor the temperature at high-current junctions. Rather, this novel approach innovatively uses a voltage sensor at each high-current junction to directly detect the voltage at each junction. If the voltage at a high-current junction is greater than a preset threshold voltage, then a predetermined action is performed to alert a user of the data center rack to take corrective action to prevent a fire from occurring at the high-current junction in question.

The innovative approach developed by the inventors thus leverages an inventive insight that what should be detected is the underlying cause of the fire risk problem (i.e., increased voltage at the high-current junction as a result of the junction dissipating too much power), instead of detecting the resulting symptom of the fire risk problem (i.e., increased temperature). Voltage sensors are typically less expensive than temperature sensors and infrared cameras, and therefore can be economically feasible to employ in large numbers within a data center. The voltage sensors can thus be said to novelly indirectly monitor the temperatures of the high-current junctions, as opposed to directly monitoring the temperatures of the junctions, as is conventional.

FIG. 1 shows a representative data center rack 100, according to an embodiment of the invention. The data center rack 100 is more generally a system. The data center rack 100 is described in relation to an exemplary alternating current (AC) input 102, an exemplary power supply 104, exemplary blade computing devices 106, an exemplary high-current conductor 108, and exemplary high-current junctions 110 and 112. However, this description pertains equally to the other AC current carrying conductor junctions, power supplies providing direct current (DC) output power, blade computing devices, high-current conductors, and high-current junctions of the data center rack 100. The AC inputs, power supplies, blade computing devices, high-current conductors, and high-current junctions are different types of components of the data center rack 100.

The AC input 102 receives AC power from AC mains, such as may be achieved via hard-wiring to the AC mains, or via plugging a cord ending in a connector to a wall outlet. The power supply 104 receives the AC power from the AC input 102, and generates direct current (DC) power to provide to the blade computing devices 106 insertable within the data center rack 100. The blade computing devices 106 are examples of data center rack components that are insertable into corresponding slots of the data center rack 100, such as in a hot plug manner. The conductor 108 connects the AC input 102 to the power supply 104, and carries high current. For example, the amount of current passing on the conductor 108 may be sixty amps.

The AC input 102 is removably connected to the conductor 108 at the high-current junction 110, and the power supply 104 is removably connected to the conductor 108 at the high-current junction 112. High current thus passes from the AC input 102 to the conductor 108 at the high-current junction 110, and high current passes from the conductor 108 to the power supply 104 at the high-current junction 112. The high-current junctions 110 and 112 may be hot plug type junctions, where the AC input 102 and the power supply 104 may be connected without having to remove power from the data center rack 100 as a whole.

Figure 2:
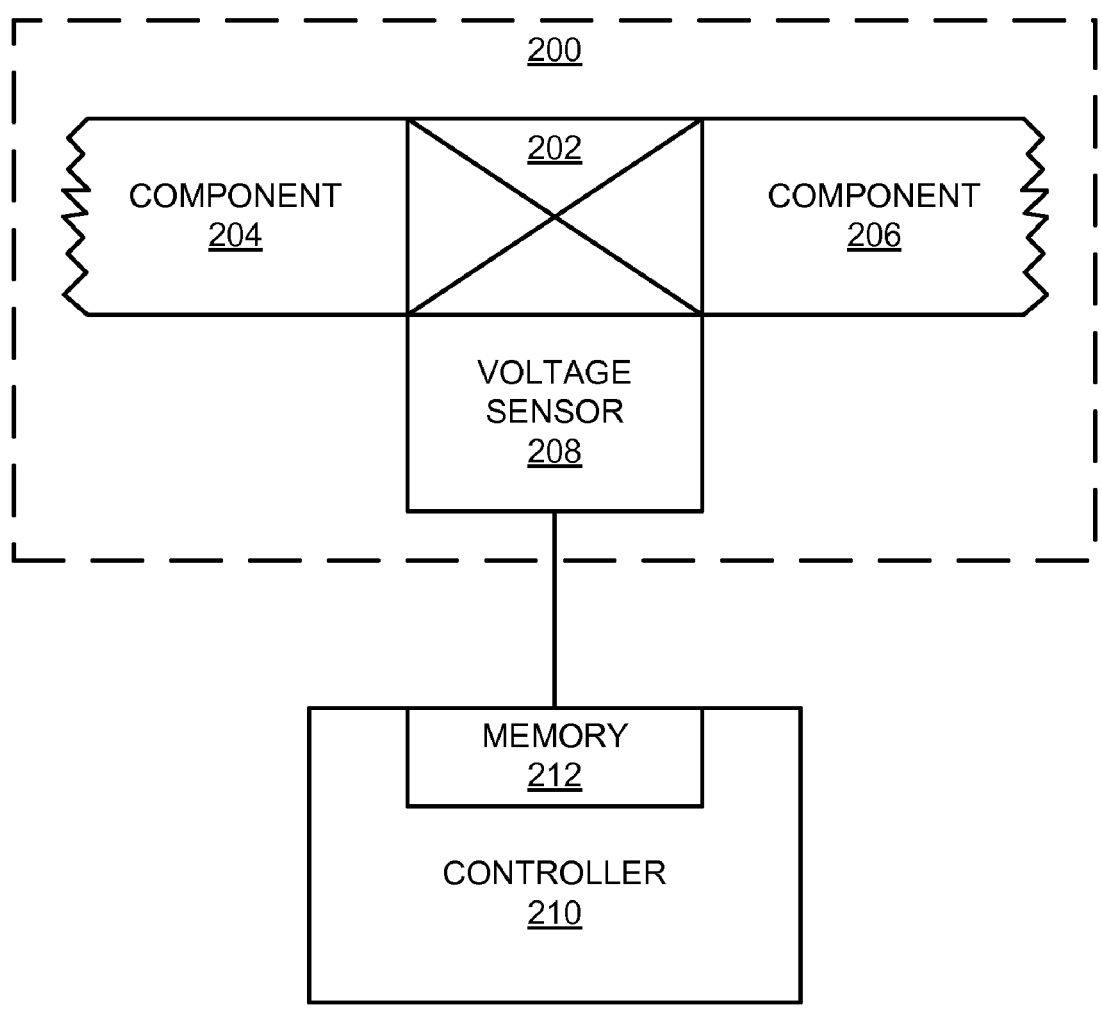
FIG. 2 is a diagram of an exemplary high-current junction and its associated voltage sensor, as connected to a controller, according to an embodiment of the present invention.

The high-current junctions 110 and 112 may be susceptible to having increased resistance over time. Furthermore, if the AC input 102 or power supply 104 makes a poor connection with the conductor 108 at its corresponding high-current junction, the electrical power dissipated by the high-current junction in question increases. In either case, the high-current junctions 110 and 112 are susceptible to having an increased temperature and causing a fire risk, as has been described above FIG. 2 shows an exemplary high-current junction area 200, according to an embodiment of the invention. The high-current junction area 200 exemplifies the area around each of the high-current junctions of FIG. 1, including the high-current junctions 110 and 112. The high-current junction area 200 includes a high-current junction 202, at which power connectors of two components 204 and 206 are electrically connected so that current passes between them. For instance, where the high-current junction 202 is the high-current junction 110, the components 204 and 206 are the AC input 102 and the conductor 108. Where the high-current junction 202 is the high-current junction 112, the components 204 and 206 are the conductor 108 and the power supply 104.

A voltage sensor 208 detects the voltage over or at the high-current junction 202. Thus, for each high-current junction of FIG. 1, there is a corresponding voltage sensor 208 as in FIG. 2. The voltage sensor 208 can store its detected voltage within a memory location of the memory 212 of the controller 210. Thus, for each high-current junction of FIG. 1, there is a corresponding (and different) memory location within the memory 212 for the corresponding voltage sensor 208 to store its detected voltage. For instance, there is a first memory location at which the voltage at the high-current junction 110 is stored, and a second memory location at which the voltage at the high-current junction 112 is stored. As such, within the data center rack 100, for instance, there are multiple high-current junctions, multiple corresponding voltage sensors, and multiple corresponding memory locations within the memory 212.

The controller 210 may be a service processor of the data center rack 100, in one embodiment. The controller 210 performs a predetermined action in response to the voltage sensor 208 detecting the voltage at the high-current junction 202 being greater than a predetermined threshold voltage. For instance, the controller 210 monitors the voltages stored within the memory locations of the memory 212. When any of these voltages exceeds the predetermined threshold voltage, the controller 210 performs the predetermined action. The predetermined action may be sounding an audible warning, displaying a visible warning, removing power from the high-current junction at which the voltage in question has been detected, or another type of action.

Figure 3:
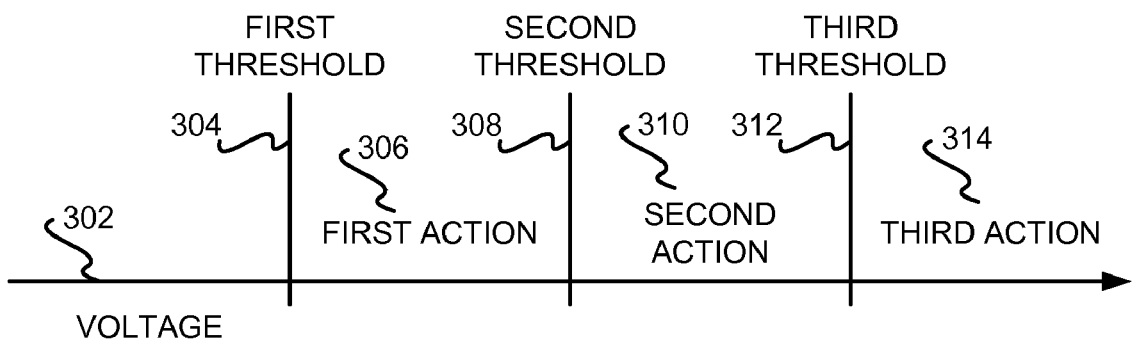
FIG. 3 is a diagram graphically depicting the different predetermined threshold voltages in accordance with which a controller operates, according to an embodiment of the present invention.

FIG. 3 graphically depicts different predetermined voltage thresholds 304, 308, and 312 in relation to which the controller 210 can perform different predetermined actions 306, 310, and 314, respectively, when the voltage 302 exceeds these thresholds, according to an embodiment of the invention. The second predetermined voltage threshold 308 is greater than the first predetermined voltage threshold 304. The third predetermined voltage threshold 312 is greater than the second predetermined voltage threshold 308.

When the voltage 302 exceeds the first predetermined voltage threshold 304, the controller 210 performs the first predetermined action 306. If the voltage 302 continues to increase and then exceeds the second predetermined voltage threshold 308, the controller 210 next performs the second predetermined action 310. If the voltage 302 still continues to increase and exceeds the third predetermined voltage threshold 312, the controller 210 then performs the third predetermined action 314.

In this way, as the voltage 302 increases, different types of actions can be performed by the controller 210 in accordance with how close the voltage 302 is to causing an actual fire. For example, the first predetermined action 306 may be to display a visible warning, so that a user is notified that at some point in the future he or she should inspect the high-current junction at which the voltage 302 was detected. The second predetermined action 308 may be to sound an audible warning, so that a user is more urgently notified to inspect this high-current junction. The third predetermined action 314 may be to remove power from the high-current junction, corresponding to the situation that a fire is likely imminent as a result of the high voltage 302.

Figure 4:
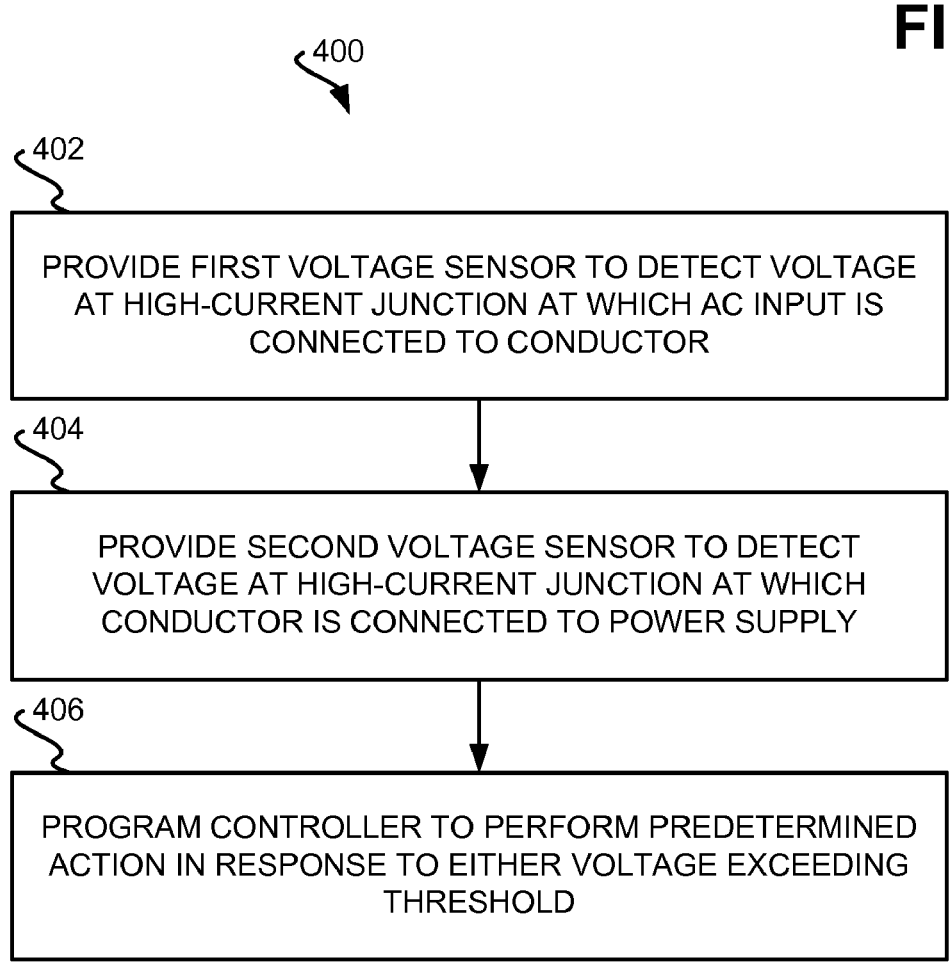
FIG. 4 is a flowchart of a method, according to an embodiment of the present invention.

In conclusion, FIG. 4 shows a method 400, according to an embodiment of the invention. A first voltage sensor is provided to detect the voltage at the high-current junction 110 at which the AC input 102 is (removably) connected to the conductor 108 (402). A second voltage sensor is provided to detect the voltage at the high-current junction 112 at which the power supply 104 is (removably) connected to the conductor 108 (404). The controller 210 is then programmed to perform a predetermined action, in response to either such voltage exceeding a predetermined voltage threshold (406). The method 400 can also be extended in accordance with other embodiments of the invention that have been described above.

It is finally noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:
1. A data center rack comprising:
an alternating current (AC) input to receive AC power from AC mains;
a power supply to receive the AC power from the AC input and to generate direct current (DC) power to provide to one or more data center rack components insertable within the data center rack;
a conductor connecting the AC input to the power supply;
a first high-current junction at which the AC input is removably connected to the conductor, where a high current passes from the AC input to the conductor;
a second high-current junction at which the power supply is removably connected to the conductor, where the high current passes from the conductor to the power supply;
a first voltage sensor to detect a first voltage at the first high-current junction;
a second voltage sensor to detect a second voltage at the second high-current junction; and,
a controller to perform a predetermined action in response to one or more of the first voltage sensor detecting the first voltage being greater than a predetermined threshold voltage and the second voltage sensor detecting the second voltage being greater than the predetermined threshold voltage.

2. The data center rack of claim 1, wherein the first and the second high-current junctions are each susceptible to having increased resistance over time.

3. The data center rack of claim 1, wherein upon the AC input making a poor connection with the conductor at the first high-current junction, an electrical power dissipated by the first high-current junction increases, rendering the first high-current junction susceptible to having an increased temperature and causing a fire risk,
and wherein upon the power supply making a poor connector with the conductor at the second high-current junction, an electrical power dissipated by the second high-current junction increases, rendering the second high-current junction susceptible to having an increased temperature and causing a fire risk.

4. The data center rack of claim 1, wherein the predetermined action is one of:
sounding an audible warning;
displaying a visible warning; and,
removing power from the high-current junction.

5. The data center rack of claim 1, wherein the predetermined action is a first predetermined action, the predetermined threshold voltage is a first predetermined threshold voltage, and the controller is to perform a second predetermined action different than the first predetermined action in response to one or more of the first voltage sensor detecting the first voltage being greater than a second predetermined threshold voltage and the second voltage sensor detecting the second voltage being greater than the second predetermined threshold voltage, the second predetermined threshold voltage greater than the first predetermined threshold voltage.

6. The data center rack of claim 5, wherein the controller is to perform a third predetermined action different than the first predetermined action and different than the second predetermined action in response to one or more of the first voltage sensor detecting the first voltage being greater than a third predetermined threshold voltage and the second voltage sensor detecting the third voltage being greater than the second predetermined threshold voltage, the third predetermined threshold voltage greater than the second predetermined threshold voltage.

7. The data center rack of claim 1, wherein the controller is a service processor having a memory having a first memory location corresponding to the first voltage sensor and a second memory location corresponding to the second voltage sensor,
and wherein the first voltage sensor is to store the first voltage within the first memory location, and the second voltage sensor is to store the second voltage within the second memory location.

8. A system comprising:
a high-current junction at which power connectors of two components are electrically connected, where a high current passes between the two components at the high-current junction;
a voltage sensor to detect a voltage at the high-current junction; and,
a controller to perform a predetermined action in response to the voltage sensor detecting the voltage at the high-current junction being greater than a predetermined threshold voltage,
wherein the high-current junction is a selected high-current junction, the voltage sensor is a selected voltage sensor, and the system further comprises:
a plurality of high-current junctions including the selected high-current junction, each high-current junction electrically connecting power connectors of two components such that a high current passes between the two components at the high-current junction; and,
a plurality of voltage sensors including the selected voltage sensor, each voltage sensor to detect a voltage at a corresponding high-current junction of the plurality of high-current junctions,
wherein the controller comprises a memory having a plurality of memory locations corresponding to the plurality of voltage sensors, each voltage sensor to store the voltages detected at the corresponding high-current junction within a corresponding memory location of the plurality of memory locations.

9. The system of claim 8, wherein the high-current junction is susceptible to having increased resistance over time.

10. The system of claim 8, wherein upon the power connectors of the two components making a poor connection at the high-current junction, an electrical power dissipated by the high-current junction increases, rendering the high-current junction susceptible to having an increased temperature and causing a fire risk.

11. The system of claim 8, wherein the predetermined action is one of:
sounding an audible warning;
displaying a visible warning; and,
removing power from the high-current junction.

12. The system of claim 8, wherein the predetermined action is a first predetermined action, the predetermined threshold voltage is a first predetermined threshold voltage, and the controller is to perform a second predetermined action different than the first predetermined action in response to the voltage sensor detecting the voltage at the high-current junction being greater than a second predetermined threshold voltage, the second predetermined threshold voltage greater than the first predetermined threshold voltage.

13. The system of claim 12, wherein the controller is to perform a third predetermined action different than the first predetermined action and different than the second predetermined action in response to the voltage sensor detecting the voltage at the high-current junction being greater than a third predetermined threshold voltage, the third predetermined threshold voltage greater than the second predetermined threshold voltage.

14. A method comprising:
providing a first voltage sensor to detect a first voltage at a first high-current junction of a data center rack, the first high-current junction removably connecting an alternating current (AC) input of the data center rack to a conductor of the data center rack, where a high current passes from the AC input to the conductor, and where the AC input is to receive AC power from AC mains;
providing a second voltage sensor to detect a second voltage at a second high-current junction of the data center rack, the second high-current junction removably connecting the conductor to a power supply of the data center rack, where a high current passes from the conductor to the power supply, and where the power supply is to receive power from the AC input and to generate direct current (DC) power to provide to one or more data center rack components insertable within the data center rack; and,
programming a controller of the data center rack to perform a predetermined action in response to one or more of the first voltage sensor detecting the first voltage being greater than a predetermined threshold voltage and the second voltage sensor detecting the second voltage being greater than the predetermined threshold voltage.

15. The method of claim 14, wherein the first and the second high-current junctions are each susceptible to having increased resistance over time,
wherein upon the AC input making a poor connection with the conductor at the first high-current junction, an electrical power dissipated by the first high-current junction increases, rendering the first high-current junction susceptible to having an increased temperature and causing a fire risk,
and wherein upon the power supply making a poor connector with the conductor at the second high-current junction, an electrical power dissipated by the second high-current junction increases, rendering the second high-current junction susceptible to having an increased temperature and causing a fire risk.

16. The method of claim 14, wherein the predetermined action is one of:
sounding an audible warning;
displaying a visible warning; and,
removing power from the high-current junction.

17. The method of claim 14, wherein the predetermined action is a first predetermined action, the predetermined threshold voltage is a first predetermined threshold voltage, and the controller is further programmed to perform a second predetermined action different than the first predetermined action in response to one or more of the first voltage sensor detecting the first voltage being greater than a second predetermined threshold voltage and the second voltage sensor detecting the second voltage being greater than the second predetermined threshold voltage, the second predetermined threshold voltage greater than the first predetermined threshold voltage.

18. The method of claim 17, wherein the controller is to perform a third predetermined action different than the first predetermined action and different than the second predetermined action in response to one or more of the first voltage sensor detecting the first voltage being greater than a third predetermined threshold voltage and the second voltage sensor detecting the third voltage being greater than the second predetermined threshold voltage, the third predetermined threshold voltage greater than the second predetermined threshold voltage.

19. The method of claim 14, wherein the controller is a service processor having a memory having a first memory location corresponding to the first voltage sensor and a second memory location corresponding to the second voltage sensor, and wherein the first voltage sensor is to store the first voltage within the first memory location, and the second voltage sensor is to store the second voltage within the second memory location.

* * * * *